US012696533B2

(12) United States Patent
Bajpai et al.

(10) Patent No.: US 12,696,533 B2
(45) Date of Patent: Jul. 28, 2026

(54) SPLIT GATE CONTACTS FOR VERTICALLY STACKED TRANSISTORS

(71) Applicant: International Business Machines Corporation, Armonk, NY (US)

(72) Inventors: Utkarsh Bajpai, Delmar, NY (US); James P Mazza, Saratoga Springs, NY (US); Shahrukh Khan, Sandy Hook, CT (US); Biswanath Senapati, Mechanicville, NY (US); Nicholas Anthony Lanzillo, Wynantskill, NY (US)

(73) Assignee: International Business Machines Corporation, Armonk, NY (US)

( * ) Notice: Subject to any disclaimer, the term of this patent is extended or adjusted under 35 U.S.C. 154(b) by 410 days.

(21) Appl. No.: 18/392,513

(22) Filed: Dec. 21, 2023

(65) Prior Publication Data

US 2025/0212506 A1     Jun. 26, 2025

(51) Int. Cl.
| | |
|---|---|
| *H10D 84/85* | (2025.01) |
| *H10D 30/43* | (2025.01) |
| *H10D 30/67* | (2025.01) |
| *H10D 62/10* | (2025.01) |
| *H10D 84/01* | (2025.01) |
| *H10D 84/03* | (2025.01) |

(52) U.S. Cl.
CPC ............ *H10D 84/85* (2025.01); *H10D 30/43* (2025.01); *H10D 30/6735* (2025.01); *H10D 30/6757* (2025.01); *H10D 62/121* (2025.01); *H10D 84/0128* (2025.01); *H10D 84/0135* (2025.01); *H10D 84/038* (2025.01)

(58) Field of Classification Search
CPC .... H10D 30/43; H10D 30/67; H10D 30/6708; H10D 30/6715; H10D 30/6735; H10D 30/6757; H10D 62/10; H10D 62/121; H10D 64/01; H10D 64/017; H10D 84/01; H10D 84/0128; H10D 84/0135; H10D 84/0172; H10D 84/0177; H10D 84/03; H10D 84/038; H10D 84/85; H10D 88/00; H10D 88/01
See application file for complete search history.

(56) References Cited

U.S. PATENT DOCUMENTS

| | | | |
|---|---|---|---|
| 10,164,121 | B2 | 12/2018 | Hatcher et al. |
| 10,714,391 | B2 | 7/2020 | Smith et al. |
| 10,879,352 | B2 | 12/2020 | Zhang et al. |

(Continued)

FOREIGN PATENT DOCUMENTS

WO        2023099000 A1      6/2023

OTHER PUBLICATIONS

Authors et al.: Disclosed Anonymously, "Separate Channel Release in Stacked Nanosheet Field Effect Transistors by Liner Protection", IPCOM000265848D, May 2021, pp. 1-12.

*Primary Examiner* — Brook Kebede
(74) *Attorney, Agent, or Firm* — Harrity & Harrity, LLP

(57)        ABSTRACT

Semiconductor devices and methods of forming the same include a top transistor that includes a first channel and a first gate. A bottom transistor includes a second channel and a second gate that has a top surface at a same height as a top surface of the first gate. A gate barrier includes a horizontal part between the bottom transistor and the top transistor and a vertical part that extends from the horizontal part to a same height as the top surfaces of the first gate and the second gate.

20 Claims, 7 Drawing Sheets

(56)             References Cited

U.S. PATENT DOCUMENTS

| | | | |
|---|---|---|---|
| 11,239,232 B2 | 2/2022 | Lilak et al. | |
| 11,502,167 B2 | 11/2022 | Hong et al. | |
| 2021/0098627 A1 * | 4/2021 | Liaw | H10D 30/6735 |
| 2022/0367461 A1 | 11/2022 | Chanemougame et al. | |
| 2022/0367658 A1 | 11/2022 | Mm et al. | |
| 2023/0017350 A1 | 1/2023 | Chanemougame et al. | |
| 2023/0085628 A1 | 3/2023 | Xie et al. | |
| 2023/0090346 A1 | 3/2023 | Xie et al. | |
| 2025/0040240 A1 * | 1/2025 | Reboh | H10D 64/01326 |

* cited by examiner

SPLIT GATE CONTACTS FOR VERTICALLY STACKED TRANSISTORS

BACKGROUND

The present invention generally relates to semiconductor device fabrication and, more particularly, to devices having vertically stacked transistors.

Complementary metal-oxide-semiconductor (CMOS) devices may be used to perform particular circuit functions, and may include a first transistor having a first polarity (e.g., a p-type device) and a second device having a second polarity (e.g., an n-type device). These transistors may be formed in close proximity to one another.

One example of a physical layout for a CMOS device is a stacked field effect transistor (FET) device, where one transistor is formed above the other. In some cases, a single gate contact may be used to electrically access a gate structure that is in contact with both the top and the bottom channels. However, in such a structure, independent control of the top and bottom devices is not possible. While the shared gate structure makes wiring to these devices simpler, it limits the types of functions that the stacked FETs can be used for. Due to the vertically stacked configuration, forming interconnects to the different devices in a manner that will not cause unintended short-circuits is particularly challenging.

SUMMARY

A semiconductor device includes a top transistor that includes a first channel and a first gate. A bottom transistor includes a second channel and a second gate that has a top surface at a same height as a top surface of the first gate. A gate barrier includes a horizontal part between the bottom transistor and the top transistor and a vertical part that extends from the horizontal part to a same height as the top surfaces of the first gate and the second gate.

A semiconductor device includes a top transistor that includes a first channel and a first gate. A bottom transistor includes a second channel and a second gate that has a top surface at a same height as a top surface of the first gate. A gate barrier electrically isolates the first gate from the bottom gate and includes a horizontal part between the bottom transistor and the top transistor and a vertical part that extends from the horizontal part to a same height as the top surfaces of the first gate and the second gate. The horizontal part includes a central part directly between the top transistor and the bottom transistor and a lateral part that is not directly between the top transistor and the bottom transistor.

A method of forming a semiconductor device includes forming a stack of semiconductor channel layers, including bottom channels having a first width and top channels having a second width that is narrower than the first width with a dielectric isolation layer between the top channels and the bottom channels. An initial gate stack on and around the bottom channels and the top channels. A first gate barrier is formed vertically through the initial gate stack to contact the dielectric isolation layer. The initial gate stack is etched back to expose the top channels and the dielectric isolation layer and to form a bottom gate stack. A second gate barrier is formed horizontally on an exposed portion of the bottom gate stack. A top gate is formed on and around the top channels, being electrically insulated from the bottom gate stack by the dielectric isolation layer, the first gate barrier, and the second gate barrier.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figures 1, 2:
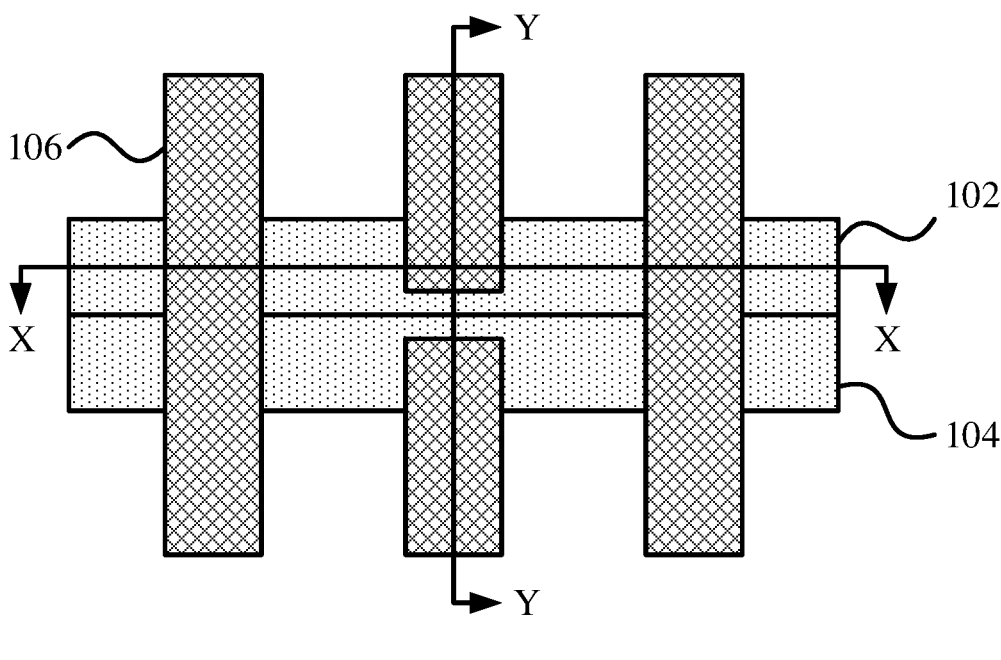
FIG. 1 is a top-down view of a semiconductor device with vertically stacked transistors with separate gate contacts, in accordance with an embodiment of the present invention.
FIG. 2 is a set of cross-sectional views of a step in the fabrication of a semiconductor device with vertically stacked transistors, showing the patterning of a bottom device stack and a top device stack, in accordance with an embodiment of the present invention.

Stacked complementary metal oxide semiconductor (CMOS) devices may include transistors, such as field effect transistors (FETs) that are positioned vertically with respect to one another. Such devices increase the areal density of a semiconductor device relative to devices that are in a horizontal arrangement. However, forming electrical contacts to both devices can be challenging, as the stacked arrangement makes it difficult to reach the bottom device from the top surface.

To address this, dielectric barriers are used to aid in the fabrication of stacked devices with electrically distinct gate structures. These gate structures can be accessed using different respective electrical contacts, making it possible to address each of the stacked devices separately. Additionally, the separation between the two gate structures makes it possible to form gates with different properties. For example, the gates may be formed with different materials, may have different work function metal layers, and may otherwise be exposed to different fabrication processes as needed.

A semiconductor device includes a top transistor that includes a first channel and a first gate. A bottom transistor includes a second channel and a second gate that has a top surface at a same height as a top surface of the first gate. A gate barrier includes a horizontal part between the bottom transistor and the top transistor and a vertical part that extends from the horizontal part to a same height as the top surfaces of the first gate and the second gate. The gate barrier provides electrical insulation between top transistor and the bottom transistor, so that each may be addressed separately and may be formed with different materials to achieve create transistors that have different electrical properties.

In some cases, the horizontal part includes a dielectric material that is distinct from a dielectric material of the vertical part. This arises because of the process for forming the horizontal part, which makes use of a selective dielectric-on-metal process. The use of such a process and material makes it possible to selectively deposit material in such a way as to electrically isolate the gates, without depositing dielectric material in places that would interfere with operation.

In some cases, the horizontal part includes a central part directly between the top transistor and the bottom transistor and a lateral part that is not directly between the top transistor and the bottom transistor. The horizontal part of the gate barrier may be formed in two parts, which simplifies fabrication as each horizontal part can be formed using appropriate deposition processes.

In some cases, the central part includes a dielectric material that is distinct from a dielectric material of the lateral part. This arises because of the process for forming the horizontal part, which makes use of a selective dielectric-on-metal process. The use of such a process and material makes it possible to selectively deposit material in such a way as to electrically isolate the gates, without depositing dielectric material in places that would interfere with operation.

In some cases, the lateral part includes a self-assembled monolayer between the dielectric material of the lateral part and the bottom transistor. The use of a self-assembled monolayer enables selective dielectric-on-metal deposition without depositing dielectric material in places that would interfere with operation.

In some cases, the gate barrier electrically isolates the first gate from the second gate. This makes it possible to selectively activate the top transistor or the bottom transistor, without triggering the other.

In some cases, a first gate contact makes electrical contact with the first gate and a second gate contact that makes electrical contact with the second gate. These structures provide electrical communication with the first gate and the second gate, so that they can be activated separately and selectively.

In some cases, the top transistor includes a top work function metal layer and the bottom transistor includes a bottom work function metal layer formed from a material different from that of the top work function metal layer. The use of different work function materials separately tunes the electrical properties of the top transistor and the bottom transistor.

In some cases, the horizontal part of the gate barrier includes a first side that is between the first gate and the second gate and a second side that is embedded in the second gate. The formation of the vertical part of the gate barrier defines how much of the horizontal part is embedded in the second gate. This structure means that the positioning of the vertical part need not be precise, so that some part of the horizontal part may extend laterally past the position of the vertical part.

A semiconductor device includes a top transistor that includes a first channel and a first gate. A bottom transistor includes a second channel and a second gate that has a top surface at a same height as a top surface of the first gate. A gate barrier electrically isolates the first gate from the bottom gate and includes a horizontal part between the bottom transistor and the top transistor and a vertical part that extends from the horizontal part to a same height as the top surfaces of the first gate and the second gate. The horizontal part includes a central part directly between the top transistor and the bottom transistor and a lateral part that is not directly between the top transistor and the bottom transistor. The gate barrier provides electrical insulation between top transistor and the bottom transistor, so that each may be addressed separately and may be formed with different materials to achieve create transistors that have different electrical properties.

In some cases, the horizontal part includes a dielectric material that is distinct from a dielectric material of the vertical part. This arises because of the process for forming the horizontal part, which makes use of a selective dielectric-on-metal process. The use of such a process and material makes it possible to selectively deposit material in such a way as to electrically isolate the gates, without depositing dielectric material in places that would interfere with operation.

In some cases, the central part includes a dielectric material that is distinct from a dielectric material of the lateral part. This arises because of the process for forming the horizontal part, which makes use of a selective dielectric-on-metal process. The use of such a process and material makes it possible to selectively deposit material in such a way as to electrically isolate the gates, without depositing dielectric material in places that would interfere with operation.

In some cases, the lateral part includes a self-assembled monolayer between the dielectric material of the lateral part and the bottom transistor. The use of a self-assembled monolayer enables selective dielectric-on-metal deposition without depositing dielectric material in places that would interfere with operation.

In some cases, a first gate contact makes electrical contact with the first gate and a second gate contact that makes electrical contact with the second gate. These structures provide electrical communication with the first gate and the second gate, so that they can be activated separately and selectively.

In some cases, the top transistor includes a top work function metal layer and the bottom transistor includes a bottom work function metal layer formed from a material different from that of the top work function metal layer. The use of different work function materials separately tunes the electrical properties of the top transistor and the bottom transistor.

In some cases, the horizontal part of the gate barrier includes a first side that is between the first gate and the second gate and a second side that is embedded in the second gate. The formation of the vertical part of the gate barrier defines how much of the horizontal part is embedded in the second gate. This structure means that the positioning of the vertical part need not be precise, so that some part of the horizontal part may extend laterally past the position of the vertical part.

A method of forming a semiconductor device includes forming a stack of semiconductor channel layers, including bottom channels having a first width and top channels having a second width that is narrower than the first width with a dielectric isolation layer between the top channels and the bottom channels. An initial gate stack on and around the bottom channels and the top channels. A first gate barrier is formed vertically through the initial gate stack to contact the dielectric isolation layer. The initial gate stack is etched back to expose the top channels and the dielectric isolation layer and to form a bottom gate stack. A second gate barrier is formed horizontally on an exposed portion of the bottom gate stack. A top gate is formed on and around the top channels, being electrically insulated from the bottom gate stack by the dielectric isolation layer, the first gate barrier, and the second gate barrier.

In some cases, the initial gate stack is recessed after forming the first gate barrier and a dielectric cap is formed on the first gate barrier after recessing the initial gate stack by a selective dielectric-on-dielectric deposition. The dielectric cap protects the portion of the initial gate stack that reaches to the bottom channels, so that removal of the initial gate stack around the top channels leaves the bottom gate stack intact.

In some cases, the dielectric cap is removed after forming the top gate. Once it has protected the bottom gate stack from the removal of material around the top channels, the dielectric cap is removed to make way for contacts to the bottom gate stack.

In some cases, forming the second gate barrier includes deposition of a self-assembled monolayer and a selective dielectric-on-metal deposition. The use of a this process to complete the gate barrier prevents the deposition of dielectric material in regions that would be difficult to remove, simplifying the fabrication process.

Referring now to FIG. 1, a top-down view is shown of a stacked FET device to illustrate a general arrangement of structures. Cross-sections X and Y are indicated, and will be used in subsequent figures to show structures during the fabrication of the device. The top-down view omits certain structures to make the underlying channels visible. Additionally, structures depicted herein may not be to scale.

A top channel 102 and a bottom channel 104 are shown, with a long axis along the X direction. The top channel 102 may be positioned over the bottom channel 104 and may have a smaller width, such that the bottom channel 104 extends laterally beyond the top channel 102. Gates 106 are shown, with a long axis along the Y direction, across the top channel 102 and the bottom channel 104. As shown, the gate 106 may be cut so that the top channel 102 and the bottom channel 104 may be addressed separately.

Referring now to FIG. 2, a set of cross-sectional views is shown of a step in the fabrication of a stacked FET device. A stack of semiconductor layers is formed on a semiconductor substrate 202, and is then etched to form a bottom device stack 212 and a top device stack 214, with shallow trench isolation (STI) structures 204 separating horizontally adjacent devices from one another.

The stack of semiconductor layers includes channel layers 206, first sacrificial layers 208, and a second sacrificial layer 210. The stack of semiconductor layers may be formed by successive epitaxial growth processes. As used herein, the terms "epitaxial growth" and/or "epitaxial deposition" refer to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

The semiconductor substrate 202 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 202 may also be a semiconductor on insulator (SOI) substrate.

In some embodiments, the semiconductor substrate 202 may be formed from silicon and the stack of semiconductor layers may be formed from silicon and silicon germanium layers, which have similar crystalline structures. The germanium concentration of the silicon germanium layers may be selected to provide etch selectivity between the layers. For example, the channel layers 206 may be formed from silicon, while the first sacrificial layers 208 may be formed from silicon germanium with a 30% germanium concentration and the second sacrificial layer 210 may be formed from silicon germanium with a 60% germanium concentration.

A mask 216 may be formed using any appropriate photolithographic process. For example, a pattern may be produced by applying a photoresist to the surface to be etched. The photoresist may be exposed to a pattern of radiation before developing the pattern into the photoresist using a resist developer. Once the patterning of the photoresist is completed, the sections covered by the photoresist are protected, while the exposed regions are removed using a selective etching process that removes the unprotected regions.

For example, a reactive ion etch (RIE) process may be used to etch down into the layers above the second sacrificial layer 210 to form the top device stack 214. RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. The selective RIE removes material from the semiconductor stack without removing the mask 216. As used herein, the term "selective" in reference to a material removal process denotes that the rate of material removal for a first material is greater than the rate of removal for at least another material of the structure to which the material removal process is being applied.

Figure 3:
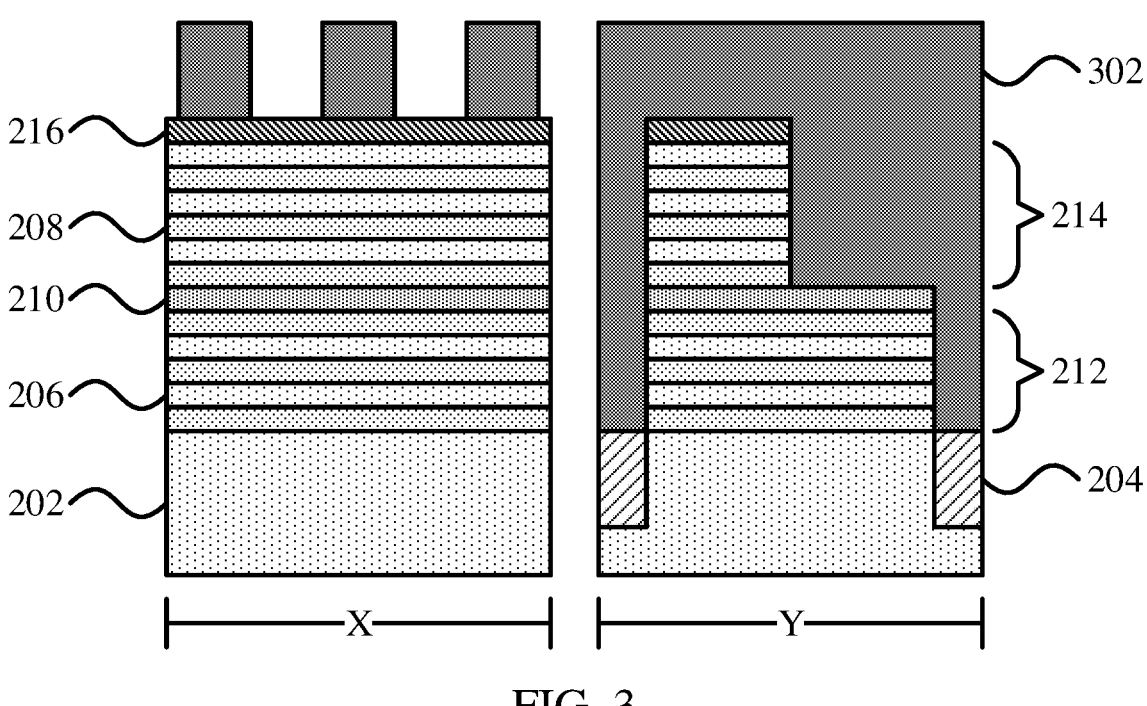
FIG. 3 is a set of cross-sectional views of a step in the fabrication of a semiconductor device with vertically stacked transistors, showing the formation of dummy gates over the device stacks, in accordance with an embodiment of the present invention.

Referring now to FIG. 3, a set of cross-sectional views is shown of a step in the fabrication of a stacked FET device. Dummy gates 302 are formed over the stack of semiconductor layers. The dummy gates 302 may be formed from any appropriate material, such as polysilicon, and may be etched using any appropriate photolithographic process.

Figure 4:
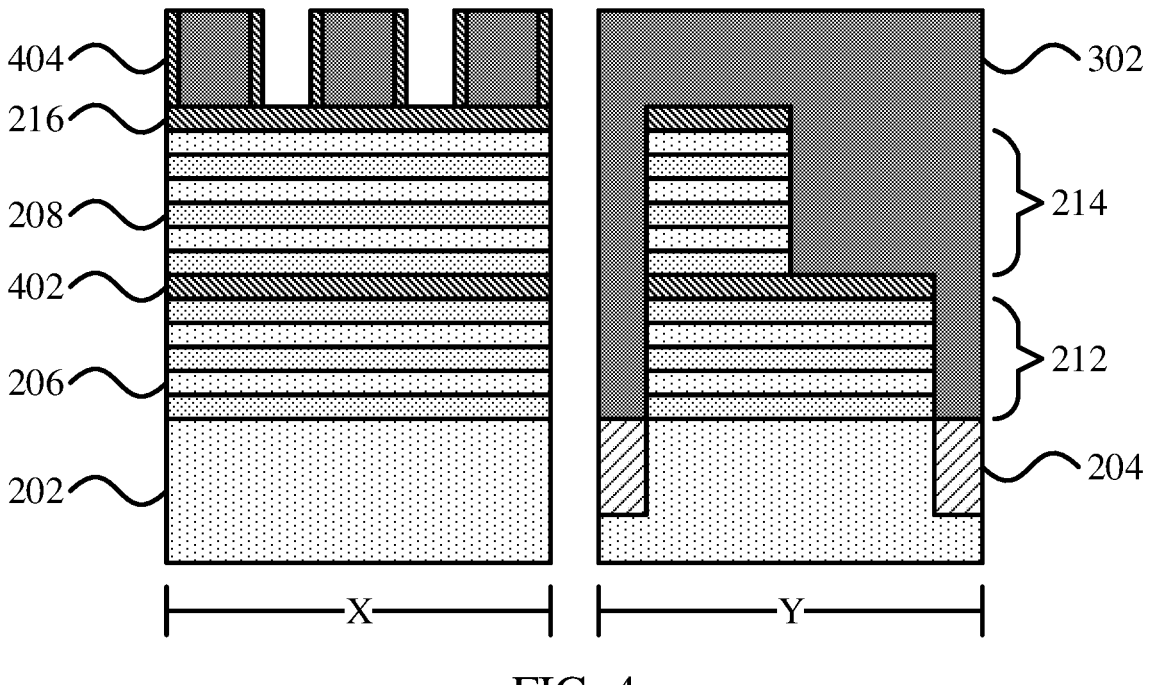
FIG. 4 is a set of cross-sectional views of a step in the fabrication of a semiconductor device with vertically stacked transistors, showing the formation of sidewalls on the dummy gates, in accordance with an embodiment of the present invention.

Referring now to FIG. 4, a set of cross-sectional views is shown of a step in the fabrication of a stacked FET device. The second sacrificial layer 210 is selectively etched away with an isotropic etching process that selectively removes the material of the second sacrificial layer without substantially damaging the channel layers 206 and the first sacrificial layers 208. A layer of dielectric material may be conformally deposited using any appropriate deposition process, such as atomic layer deposition (ALD), to fill the resulting gap between the bottom device stack 212 and the top device stack 214, forming a dielectric isolation layer 402. Excess dielectric material may be removed from horizontal surfaces using a timed RIE, which leaves behind dielectric material on vertical surfaces to form sidewall spacers 404. The dielectric material may, for example, include silicon nitride.

Figure 5:
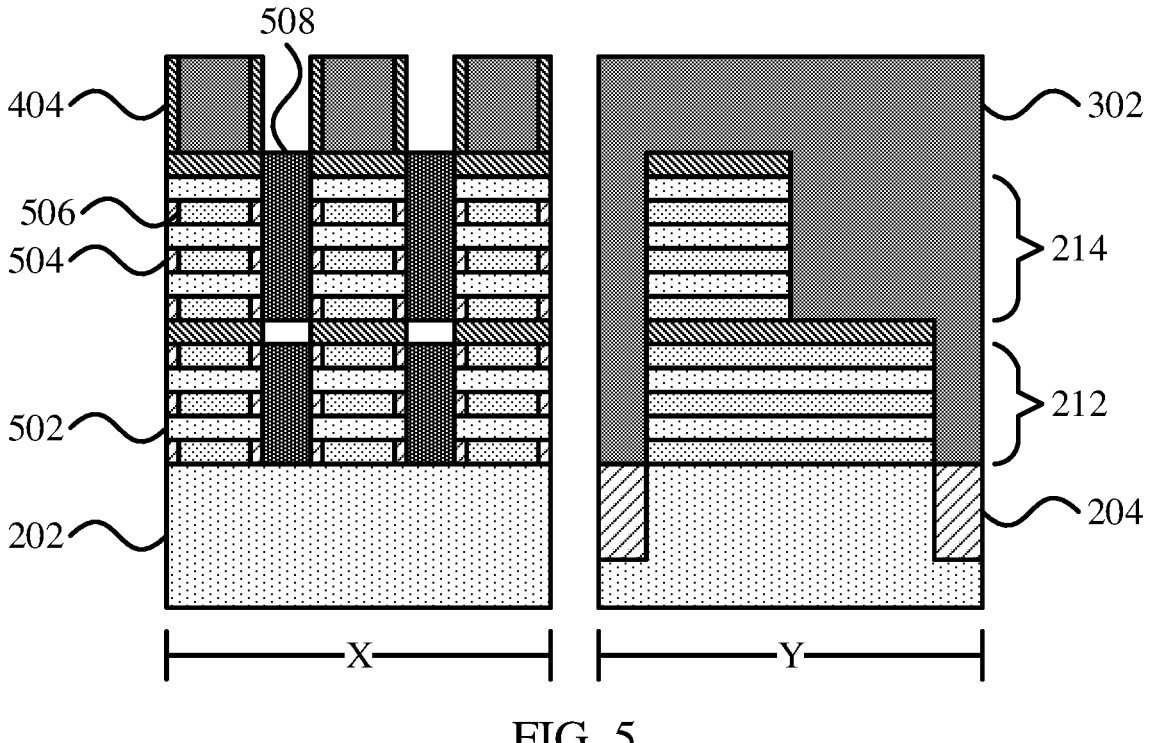
FIG. 5 is a set of cross-sectional views of a step in the fabrication of a semiconductor device with vertically stacked transistors, showing the formation of source/drain structures, in accordance with an embodiment of the present invention.

Referring now to FIG. 5, a set of cross-sectional views is shown of a step in the fabrication of a stacked FET device. The dummy gates 302 may be used as a mask for a selective anisotropic etch into the stacks of semiconductor layers. The etch divides the channel layers 206 into channels 502. The exposed ends of the first sacrificial layers 208 may be recessed and inner spacers 504 may be formed from any appropriate dielectric material. In some cases, the side surfaces of the first sacrificial layers 208 may be oxidized, causing silicon dioxide to form and driving germanium inward, creating sacrificial structures 506 with a higher germanium concentration. Excess silicon dioxide may be etched away from surfaces of the channels 502 using a selective anisotropic etch.

Source/drain structures 508 may be epitaxially grown from the exposed side surfaces of the channels 502. The source/drain structures 508 may be doped in situ using any appropriate dopant, for example corresponding with a semiconductor device polarity. The epitaxial growth may be timed to prevent source/drain structures of the top device stack 214 from making electrical contact with the bottom device stack 212.

Figure 6:
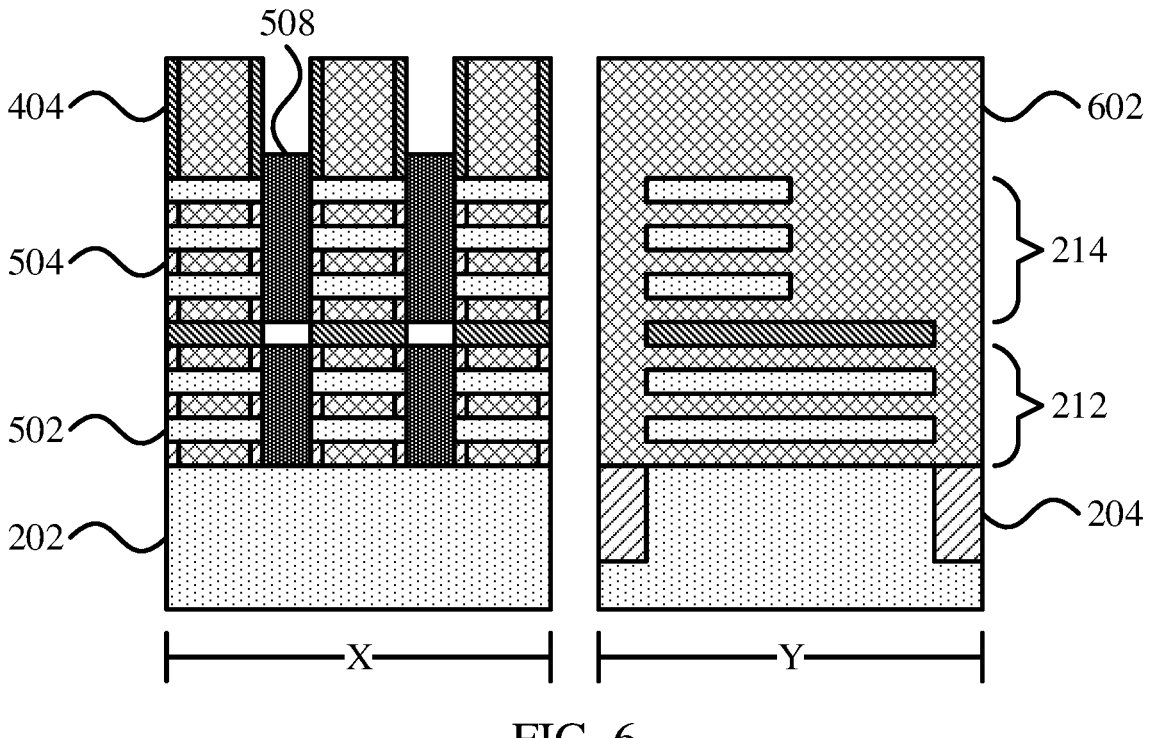
FIG. 6 is a set of cross-sectional views of a step in the fabrication of a semiconductor device with vertically stacked transistors, showing the replacement of the dummy gates with an initial gate stack, in accordance with an embodiment of the present invention.

Referring now to FIG. 6, a set of cross-sectional views is shown of a step in the fabrication of a stacked FET device. The dummy gates 302 are selectively etched away, exposing the stacks of semiconductor layers. The sacrificial structures 506 are removed using a selective isotropic etch that leaves the channels 502 intact. A gate stack 602 is then formed on and around the channels 502, for example including a gate dielectric, a work function metal, and a gate conductor.

The gate dielectric may include a high-k dielectric material. The term "high-k" refers to a material having a dielectric constant k greater than that of silicon dioxide. Examples of high-k dielectric materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as lanthanum and aluminum.

The gate conductor may be formed from any appropriate conductive metal such as, e.g., tungsten, nickel, titanium, molybdenum, tantalum, copper, platinum, silver, gold, ruthenium, iridium, rhenium, rhodium, cobalt, and alloys thereof. The gate conductor may alternatively be formed from a doped semiconductor material such as, e.g., doped polysilicon.

An optional work function metal may be used to further set the properties of the device, such as its threshold voltage. The work function metal may be selected in accordance with a device polarity type.

Figure 7:
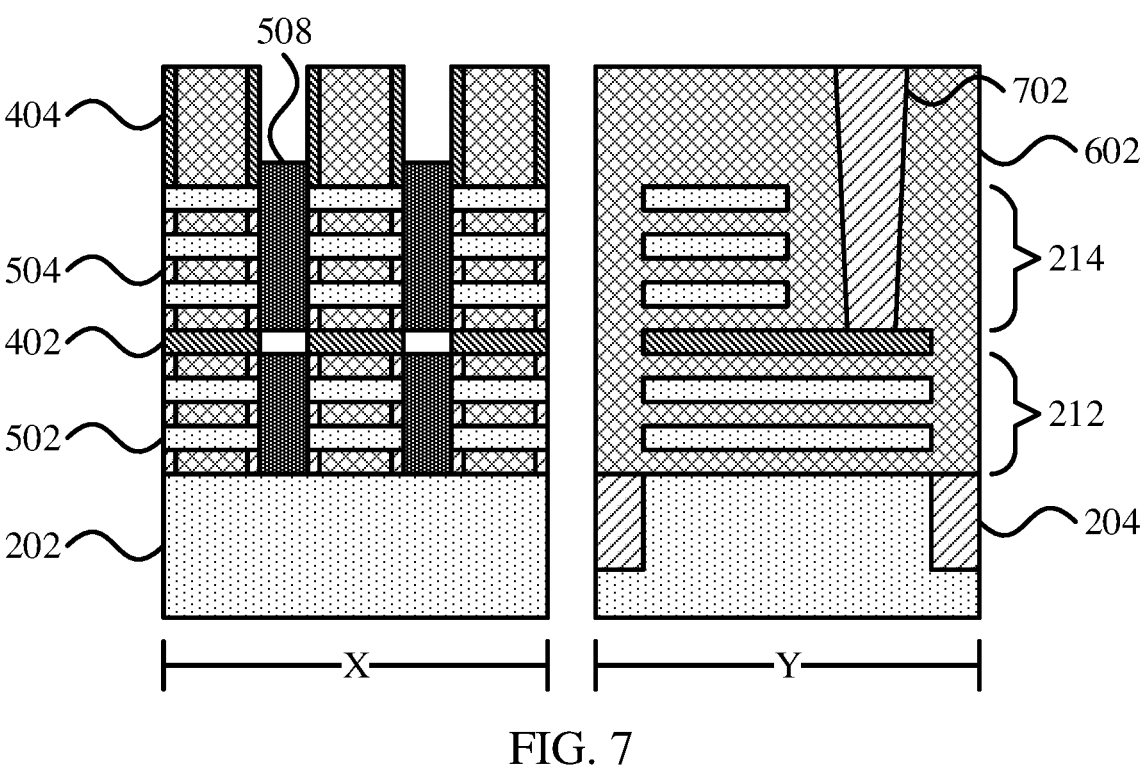
FIG. 7 is a set of cross-sectional views of a step in the fabrication of a semiconductor device with vertically stacked transistors, showing the formation of a first gate barrier through the initial gate stack, in accordance with an embodiment of the present invention.

Referring now to FIG. 7, a set of cross-sectional views is shown of a step in the fabrication of a stacked FET device. The gate stack 602 is cut using an appropriate mask and selective anisotropic etch. The etch stops on the isolation layer and cuts across the width of the gate stack 602. The resulting hole may be filled with a dielectric material, such as silicon dioxide or silicon nitride, to form a first gate barrier 702. Any appropriate deposition process may be used to deposit the dielectric material, such as ALD, chemical vapor deposition (CVD), or physical vapor deposition (PVD). The positioning of the first gate barrier 702 need not align with the edge of the dielectric isolation layer 402, so that some part of the dielectric isolation layer 402 may extend laterally past the first gate barrier 702.

Figure 8:
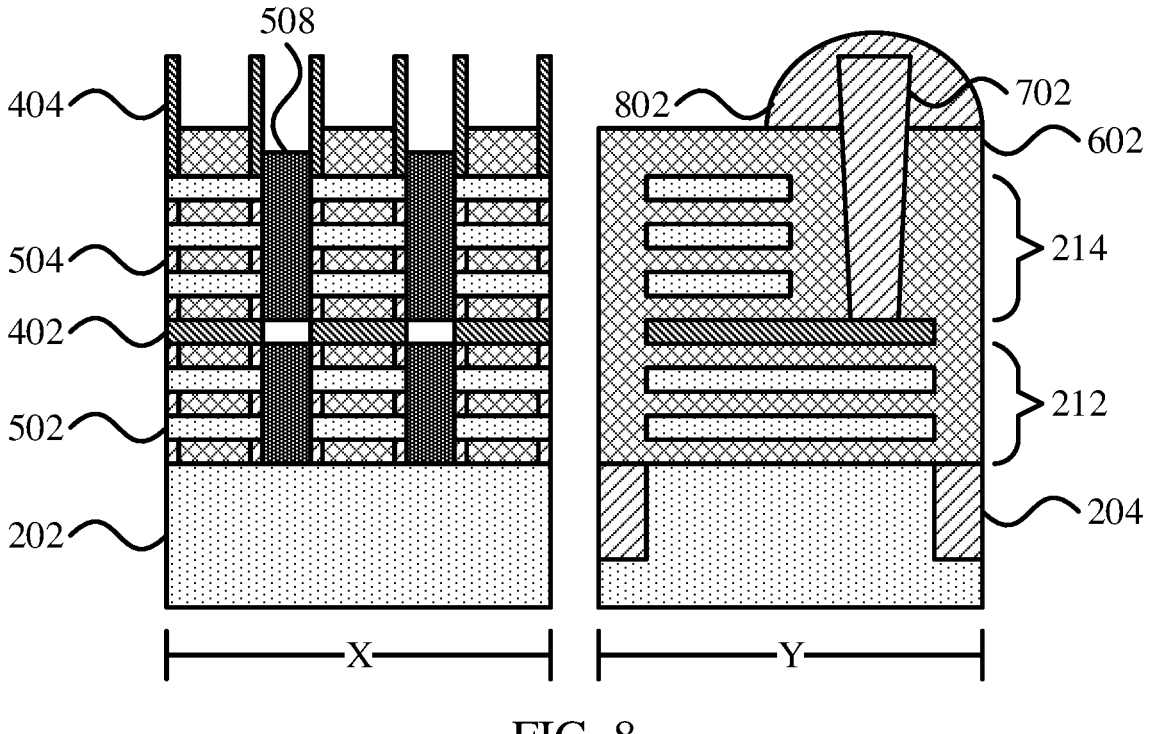
FIG. 8 is a set of cross-sectional views of a step in the fabrication of a semiconductor device with vertically stacked transistors, showing the formation of a dielectric cap on the first gate barrier, in accordance with an embodiment of the present invention.
Figure 9:
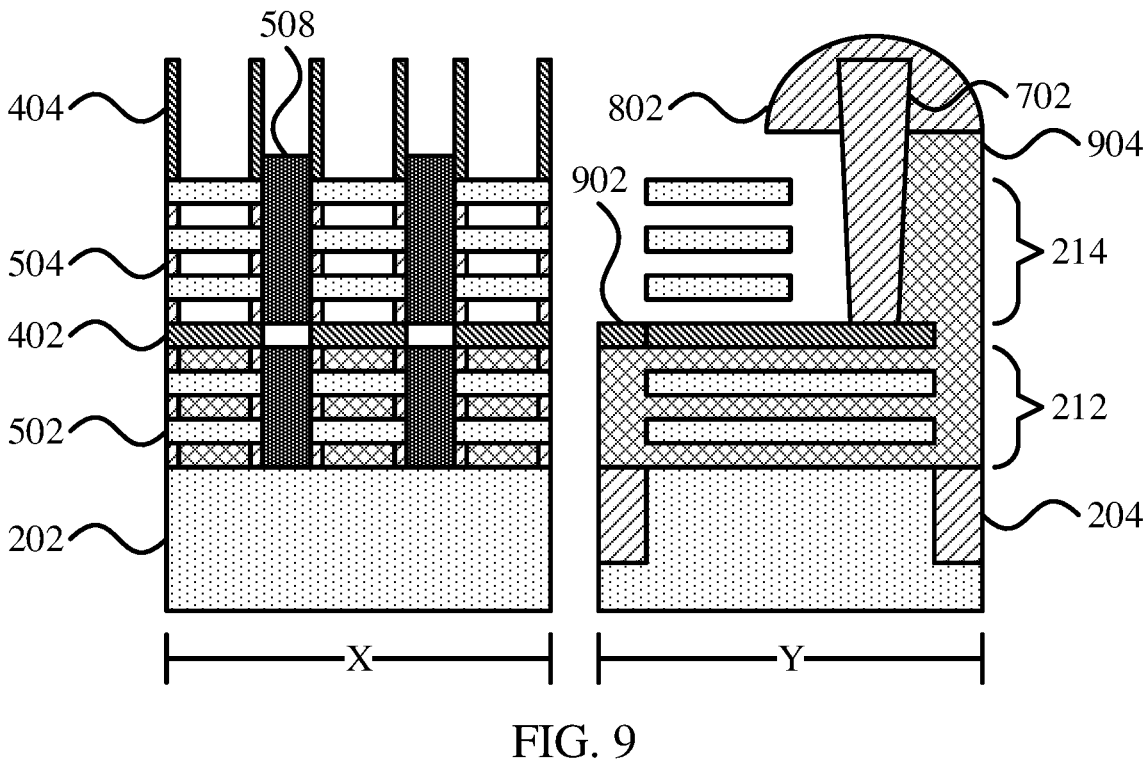
FIG. 9 is a set of cross-sectional views of a step in the fabrication of a semiconductor device with vertically stacked transistors, showing the removal of the initial gate stack from around the top device stack and the formation of a second gate barrier to define a bottom gate stack, in accordance with an embodiment of the present invention.

Referring now to FIG. 8, a set of cross-sectional views is shown of a step in the fabrication of a stacked FET device. The gate stack 602 is recessed using any appropriate etch, exposing side surfaces of the first gate barrier 702 at a top of the structure. A dielectric cap 802 is formed on the first gate barrier 702, covering the exposed surfaces, using a selective dielectric-on-dielectric deposition. The dielectric cap 802 ensures that the top part of the gate stack 602 is protected from subsequent gate recessing Referring now to FIG. 9, a set of cross-sectional views is shown of a step in the fabrication of a stacked FET device. The exposed top surface of the gate stack 602 is selectively etched away to form bottom gate stack 904, exposing channels of the top device stack 214. A second gate barrier 902 is formed on the exposed horizontal surface of the bottom gate stack 904.

The etch of the gate stack 602 may be performed in two stages. In a first stage, a selective isotropic etch is performed to remove the material from around the channels of the top device stack 214. A selective anisotropic etch may then be performed to further recess the gate stack 602 to a level below the top surface of the dielectric isolation layer 402. Each of these etches may be timed or otherwise limited to prevent over-etch.

The second gate barrier 902 may be formed by, e.g., depositing a self-assembled monolayer that selectively adheres to the exposed horizontal surface of the bottom gate stack 904. A selective dielectric-on-metal deposition process may be used to form the second gate barrier 902 on the self-assembled monolayer. Area-selective atomic layer deposition (AS-ALD) may be used to form self-assembled monolayers (SAMs) as inhibitors to preferentially perform ALD on one surface and not another other. SAMs are organic molecules that include an anchoring group that bonds to a surface, a backbone part which takes part in the self-assembly process via van der Walls interactions, and a tail functional group that modifies the final surface property after SAM formation. By careful choice of these functional groups, selective SAM formation on either metal or dielectric surfaces can be achieved.

The second gate barrier 902 seals the bottom gate stack 904, isolating it from subsequent processing of the top device stack 214. In some embodiments, the second gate barrier 902 may be formed from a dielectric material that is different from the dielectric material of the first gate barrier 702. In some cases, the dielectric isolation layer 402 may be formed from the same dielectric material as either the first gate barrier 702 or the second gate barrier 902, or may be formed from a different material from both. In some cases, the dielectric isolation layer 402 and the first gate barrier 702 may be formed from SiN, SiBCN, SiCN, SiOC, or SiOCN. In some cases, the second gate barrier 902 may be formed from $SiO_2$.

Figure 10:
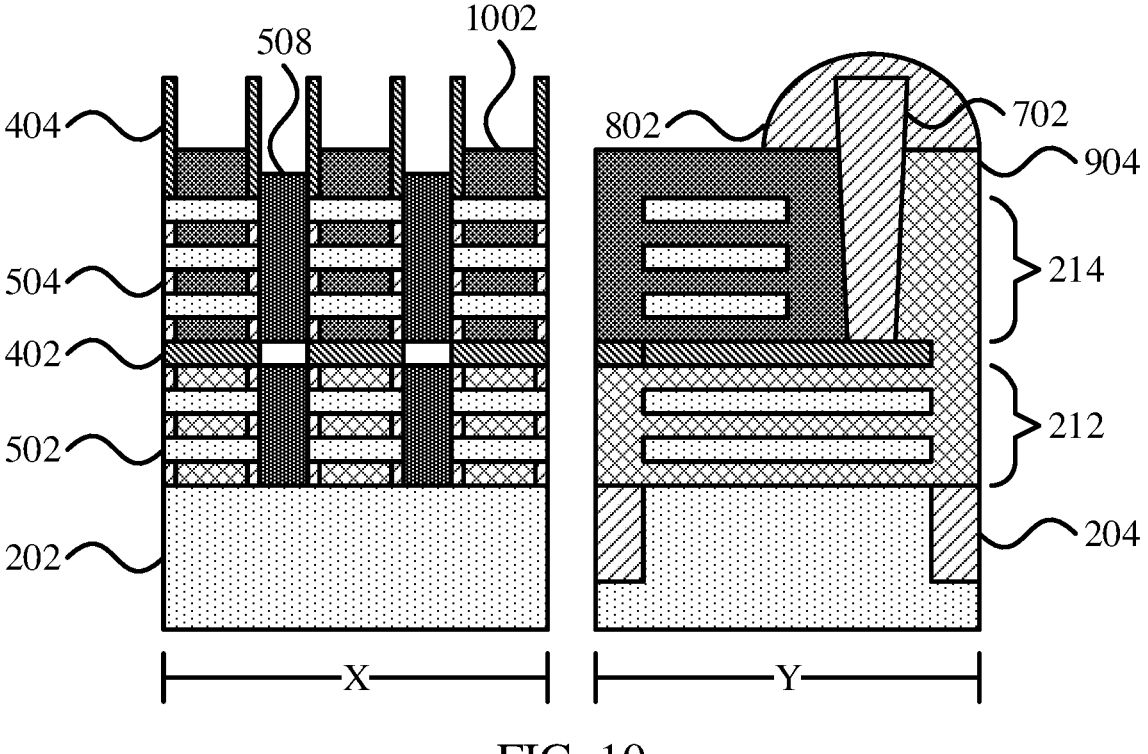
FIG. 10 is a set of cross-sectional views of a step in the fabrication of a semiconductor device with vertically stacked transistors, showing the formation of a top gate stack, in accordance with an embodiment of the present invention.

Referring now to FIG. 10, a set of cross-sectional views is shown of a step in the fabrication of a stacked FET device. A top gate stack 1002 is deposited on and around the channels 502 of the top device stack 214. In some cases, the top gate stack 1002 may use the same gate dielectric as the bottom gate stack 904. In other cases, that gate dielectric material may be etched away and may be replaced by a conformal deposition of some other dielectric material. For example, one gate dielectric may include a high-k dielectric material and the other may include a low-k dielectric material. The top gate stack 1002 contacts some parts of the dielectric isolation layer 402, while other parts of the dielectric isolation layer 402 are embedded in the bottom gate stack 904.

The top gate stack 1002 may include a gate conductor that is formed from the same material as the gate conductor of the bottom gate stack 904 or may use a different gate conductor. Similarly, the top gate stack 1002 may use a same work function metal, a different work function metal, or may include no work function metal at all.

Figure 11:
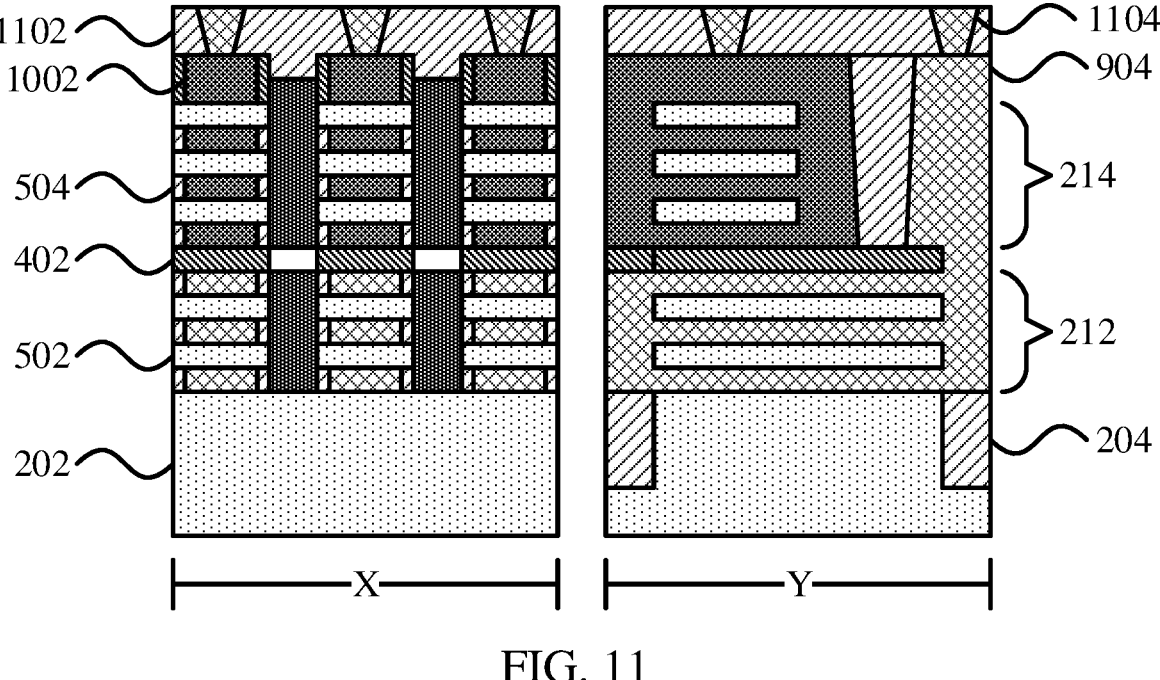
FIG. 11 is a set of cross-sectional views of a step in the fabrication of a semiconductor device with vertically stacked transistors, showing the removal of the dielectric cap and the formation of separate contacts to the top gate stack and the bottom gate stack, in accordance with an embodiment of the present invention.

Referring now to FIG. 11, a set of cross-sectional views is shown of a step in the fabrication of a stacked FET device. A chemical mechanical planarization (CMP) is performed to remove the dielectric cap 802 and the exposed portion of the first gate barrier 702, polishing down to the top surfaces of the bottom gate stack 904 and the top gate stack 1002. CMP is performed using, e.g., a chemical or granular slurry and mechanical force to gradually remove upper layers of the device. The slurry may be formulated to be unable to dissolve, for example, the gate conductor material, resulting in the CMP process's inability to proceed any farther than that layer.

An interlayer dielectric 1102 is deposited over the top gate stack 1002 and the bottom gate stack 904 using any appropriate deposition and material, such as a CVD of silicon dioxide. Vias may be patterned and etched into the interlayer dielectric 1102 using a selective anisotropic etch. The vias may then be filled using any appropriate conductive material to form gate contacts 1104, including separate contacts for the top gate stack 1002 and the bottom gate stack 904.

Figure 12:
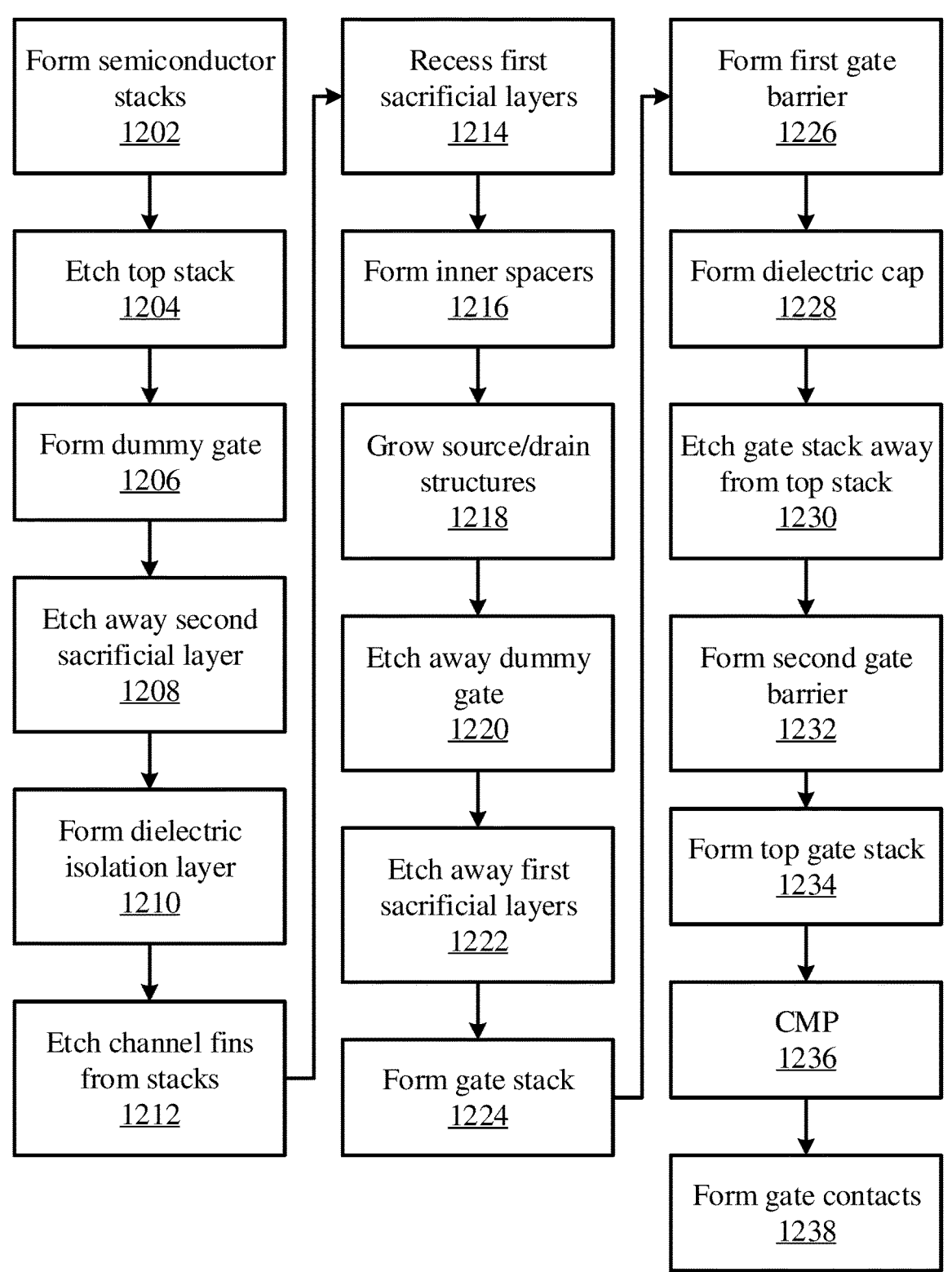
FIG. 12 is a block/flow diagram of a method of fabricating a semiconductor device with vertically stacked transistors.

Referring now to FIG. 12, a method for fabricating a stacked FET device with separate gate contacts is shown. Block 1202 forms semiconductor stacks, including channel layers 206, first sacrificial layers 208, and second sacrificial layer 210 by successive stages of epitaxial growth from a semiconductor substrate. As noted above, these layers may be formed from silicon and silicon germanium, with the latter having differing concentrations of germanium to provide etch selectivity. The layers may be grown to a thickness determined by the germanium concentrations used, where such materials have a threshold thickness when grown from a silicon surface, beyond which discontinuities will be introduced.

Block 1204 etches the top device stack 214 relative to the bottom device stack 212, for example using a mask 216 to define a pattern and an anisotropic etch, such as an RIE, to remove exposed layers of the top device stack 214. Block 1206 forms a dummy gate 302 over and perpendicular to the stacks, for example by depositing polysilicon using any appropriate deposition process and patterning the polysilicon using a photolithographic process.

Block 1208 etches away the second sacrificial layer 210 using a selective isotropic etching process. Block 1210 then forms the dielectric isolation layer 402 in its place, using a conformal deposition of dielectric material to electrically isolate the top device stack 214 from the bottom device stack 212. Block 1212 then etches down, using the dummy gate 302 as a mask, to form fins from the stacks. This etch cuts the channel layers 206 into channels 502.

Block 1214 performs a selective isotropic etch to recess the first sacrificial layers 208 relative to the channel layers 206, leaving recessed sacrificial structures 506. Block 1216 forms the inner spacers 504. The formation of the inner spacers 504 may include a conformal deposition of dielectric material, followed by an anisotropic etch that removes any of the dielectric material that is not protected within the recesses. In some embodiments, the inner spacers may instead be formed by a germanium condensation process, whereby oxidation occurs preferentially on the silicon germanium of the sacrificial layers, forming silicon dioxide at the side surfaces and forcing germanium farther within the sacrificial layers. Block 1218 forms the source/drain structures 508 by epitaxial growth from exposed side surfaces of the channels 502. The source/drain structures may be in situ doped during the growth process, providing any appropriate device polarity.

Block 1220 etches away the dummy gate 302 using a selective isotropic etch, thereby exposing the semiconductor stacks. Block 1222 removes the remaining sacrificial structures 506 using a selective isotropic etch, which leaves the channels 502 suspended. Block 1224 then forms a gate stack 602, for example including a gate dielectric and a gate conductor, on and around the channels 502 using respective conformal deposition processes. This initial gate stack 602 is formed on both the top device stack 214 and the bottom device stack 212.

Block 1226 forms a first gate barrier 702 by anisotropically etching down through the gate stack 602 to form a hold, and then filling the hole with any appropriate dielectric material using any appropriate deposition process. The first gate barrier 702 cuts through the width of the gate stack 602.

Block 1228 recesses the gate stack 602 and then forms a dielectric cap 802 on exposed portions of the first gate barrier 702 using a selective dielectric-on-dielectric deposition process. Block 1230 etches away portions of the gate stack 602 that are on the top device stack 214, exposing the channels of the top device stack 214. Block 1232 then forms the second gate barrier 902, leaving the bottom gate stack 904 electrically isolated from the top device stack 214. The second gate barrier 902 may be formed by the selective formation of a self-assembled monolayer on the exposed metal surface of the bottom gate stack 904, followed by a selective dielectric-on-metal deposition.

Block 1234 forms the top gate stack 1002, for example by conformal deposition of a new gate conductor, which may have properties that differ from the gate conductor of the bottom gate stack 904. Block 1236 performs a CMP to polish down to the level of the top gate stack 1002 and the bottom gate stack 904. Block 1238 then forms gate contacts 1104, for example by forming vias in an interlayer dielectric 1102 and filling the vias with conductive material.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of split gate contacts for vertically stacked transistors (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device, comprising:
a top transistor that includes a first channel and a first gate;
a bottom transistor that includes a second channel and a second gate that has a top surface at a same height as a top surface of the first gate; and
a gate barrier that includes a horizontal part between the bottom transistor and the top transistor and a vertical part that extends from the horizontal part to a same height as the top surfaces of the first gate and the second gate.

2. The semiconductor device of claim 1, wherein the horizontal part includes a dielectric material that is distinct from a dielectric material of the vertical part.

3. The semiconductor device of claim 1, wherein the horizontal part includes a central part directly between the top transistor and the bottom transistor and a lateral part that is not directly between the top transistor and the bottom transistor.

4. The semiconductor device of claim 3, wherein the central part includes a dielectric material that is distinct from a dielectric material of the lateral part.

5. The semiconductor device of claim 4, wherein the lateral part includes a self-assembled monolayer between the dielectric material of the lateral part and the bottom transistor.

6. The semiconductor device of claim 1, wherein the gate barrier electrically isolates the first gate from the second gate.

7. The semiconductor device of claim 1, further comprising a first gate contact that makes electrical contact with the first gate and a second gate contact that makes electrical contact with the second gate.

8. The semiconductor device of claim 1, wherein the top transistor includes a top work function metal layer and the bottom transistor includes a bottom work function metal layer formed from a material different from that of the top work function metal layer.

9. The semiconductor device of claim 1, wherein the horizontal part of the gate barrier includes a first side that is between the first gate and the second gate and a second side that is embedded in the second gate.

10. A semiconductor device, comprising:
a top transistor that includes a first channel and a first gate;

a bottom transistor that includes a second channel and a second gate that has a top surface at a same height as a top surface of the first gate; and
a gate barrier that electrically isolates the first gate from the second gate and that includes a horizontal part between the bottom transistor and the top transistor and a vertical part that extends from the horizontal part to a same height as the top surfaces of the first gate and the second gate, wherein the horizontal part includes a central part directly between the top transistor and the bottom transistor and a lateral part that is not directly between the top transistor and the bottom transistor.

11. The semiconductor device of claim 10, wherein the horizontal part includes a dielectric material that is distinct from a dielectric material of the vertical part.

12. The semiconductor device of claim 10, wherein the central part includes a dielectric material that is distinct from a dielectric material of the lateral part.

13. The semiconductor device of claim 12, wherein the lateral part includes a self-assembled monolayer between the dielectric material of the lateral part and the bottom transistor.

14. The semiconductor device of claim 10, further comprising a first gate contact that makes electrical contact with the first gate and a second gate contact that makes electrical contact with the second gate.

15. The semiconductor device of claim 10, wherein the top transistor includes a top work function metal layer and the bottom transistor includes a bottom work function metal layer formed from a material different from that of the top work function metal layer.

16. The semiconductor device of claim 10, wherein the horizontal part of the gate barrier includes a first side that is between the first gate and the second gate and a second side that is embedded in the second gate.

17. A method of forming a semiconductor device, comprising:
forming a stack of semiconductor channel layers, including bottom channels having a first width and top channels having a second width that is narrower than the first width with a dielectric isolation layer between the top channels and the bottom channels;
forming an initial gate stack on and around the bottom channels and the top channels;
forming a first gate barrier vertically through the initial gate stack to contact the dielectric isolation layer;
etching back the initial gate stack to expose the top channels and the dielectric isolation layer and to form a bottom gate stack;
forming a second gate barrier horizontally on an exposed portion of the bottom gate stack; and
forming a top gate on and around the top channels, being electrically insulated from the bottom gate stack by the dielectric isolation layer, the first gate barrier, and the second gate barrier.

18. The method of claim 17, further comprising recessing the initial gate stack after forming the first gate barrier and forming a dielectric cap on the first gate barrier after recessing the initial gate stack by a selective dielectric-on-dielectric deposition.

19. The method of claim 18, further comprising removing the dielectric cap after forming the top gate.

20. The method of claim 17, wherein forming the second gate barrier includes deposition of a self-assembled monolayer and a selective dielectric-on-metal deposition.

* * * * *